(12) United States Patent
Xu et al.

(10) Patent No.: US 11,644,610 B1
(45) Date of Patent: May 9, 2023

(54) PHASE PLATE AND FABRICATION METHOD FOR COLOR-SEPARATED LASER BACKLIGHT IN DISPLAY SYSTEMS

(71) Applicant: Facebook Technologies, LLC, Menlo Park, CA (US)

(72) Inventors: Jian Xu, Redmond, WA (US);
Xingzhou Tu, Redmond, WA (US);
Ying Geng, Bellevue, WA (US);
Jacques Gollier, Sammamish, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/726,270

(22) Filed: Apr. 21, 2022

Related U.S. Application Data

(60) Provisional application No. 63/305,090, filed on Jan. 31, 2022.

(51) Int. Cl.
*F21V 8/00* (2006.01)
*G02F 1/1335* (2006.01)
*G02B 27/01* (2006.01)
*G03F 7/20* (2006.01)

(52) U.S. Cl.
CPC .......... *G02B 6/005* (2013.01); *G02B 6/0066* (2013.01); *G02B 27/0172* (2013.01); *G02F 1/133514* (2013.01); *G02F 1/133528* (2013.01); *G03F 7/70191* (2013.01); *G02B 2027/0112* (2013.01); *G02F 2201/52* (2013.01)

(58) Field of Classification Search
CPC ..................................... G02B 6/005
See application file for complete search history.

(56) References Cited

U.S. PATENT DOCUMENTS 5,506,701 A * 4/1996 Ichikawa ................. G02B 5/32
359/22
6,104,446 A * 8/2000 Blankenbecler .. G02F 1/133621
349/5

* cited by examiner

*Primary Examiner* — Edmond C Lau
(74) *Attorney, Agent, or Firm* — Mannava & Kang, P.C.

(57) ABSTRACT

According to examples, a phase plate may include a transparent substrate and a photopolymer layer attached to the transparent substrate. The photopolymer layer may adjust a backlight via a phase adjustment and focusing. The phase plate may focus a plurality of red, green, and blue components of the backlight onto respective red, green, and blue subpixels of a thin-film-transistor (TFT) layer deposited thereon. A distance between the photopolymer layer of the phase plate and the plurality of red, green, and blue subpixels of the thin-film-transistor (TFT) layer may be in a range from about 200 µm to about 500 µm. In some examples, the phase plate may be part of a liquid crystal display (LCD) apparatus along with a red, green, blue (RGB) laser to provide backlight; a grating light guide to transmit the backlight; and a liquid crystal display (LCD) layer on the thin-film-transistor (TFT) layer.

4 Claims, 14 Drawing Sheets

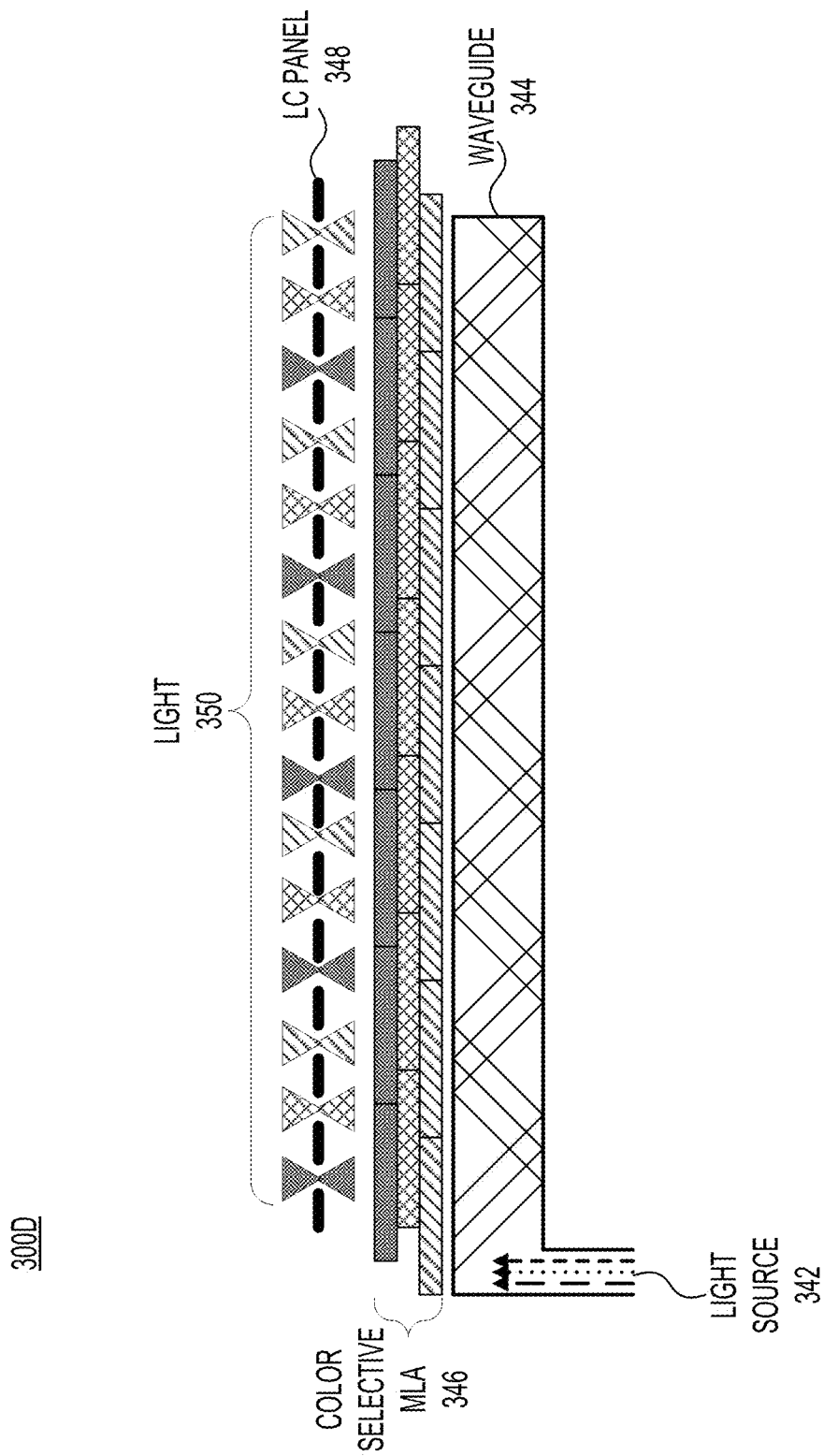

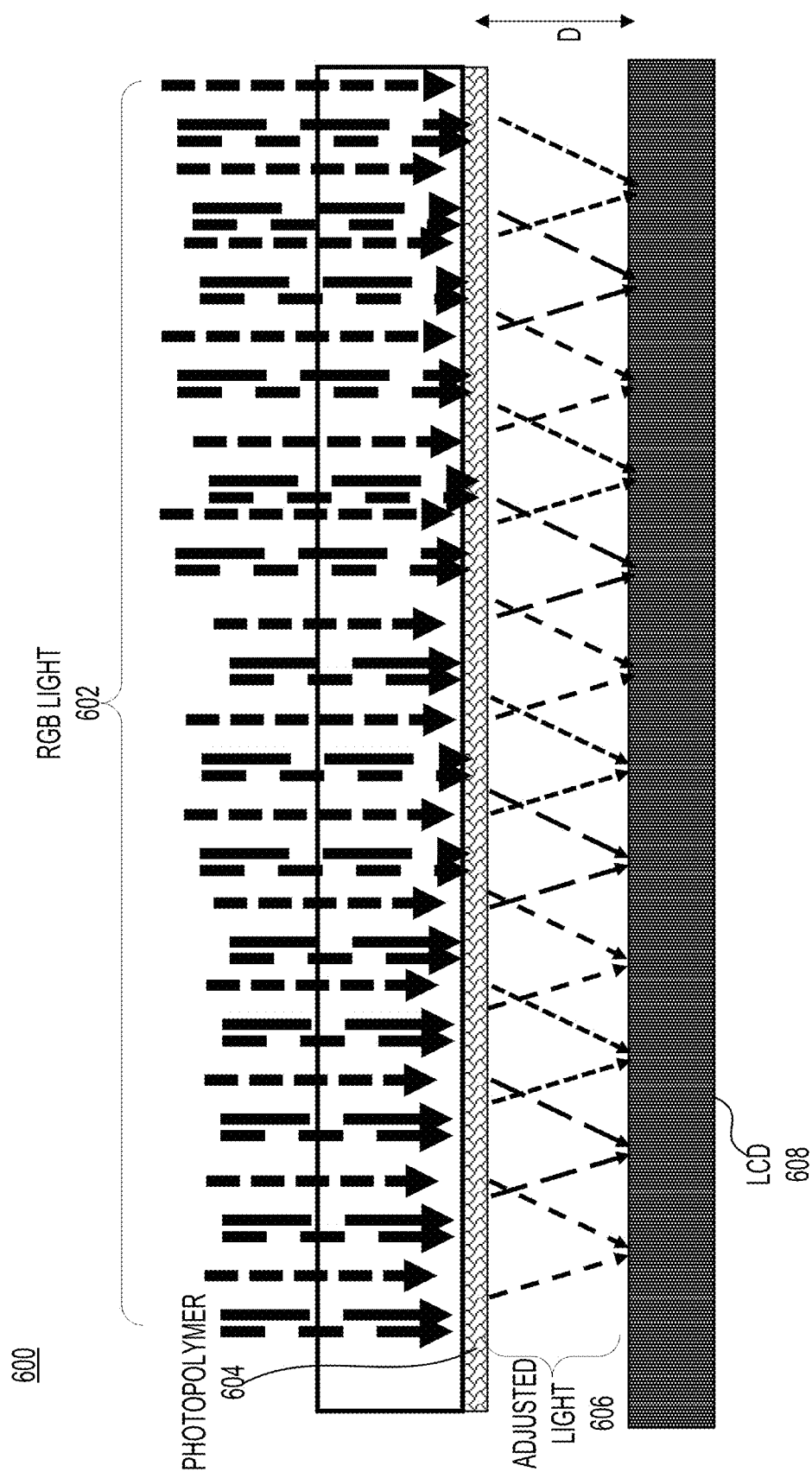

PHASE PLATE AND FABRICATION METHOD FOR COLOR-SEPARATED LASER BACKLIGHT IN DISPLAY SYSTEMS

CROSS-REFERENCE TO RELATED APPLICATIONS OR PRIORITY

This patent application is related to or claims priority to U.S. Provisional Patent Application Ser. No. 63/305,090 filed on Jan. 31, 2022. The disclosures of the provisional patent application are hereby incorporated by reference for all purposes.

TECHNICAL FIELD

This patent application relates generally to display systems, and more specifically, to phase plate and fabrication method for color-separated laser backlight in display systems.

BACKGROUND

With recent advances in technology, prevalence and proliferation of content creation and delivery has increased greatly in recent years. In particular, interactive content such as virtual reality (VR) content, augmented reality (AR) content, mixed reality (MR) content, and content within and associated with a real and/or virtual environment (e.g., a "metaverse") has become appealing to consumers.

To facilitate delivery of this and other related content, service providers have endeavored to provide various forms of wearable display systems. One such example may be a head-mounted device (HMD), such as a wearable headset, wearable eyewear, or eyeglasses. In some examples, the head-mounted device (HMD) may employ a first projector and a second projector to direct light associated with a first image and a second image, respectively, through one or more intermediary optical components at each respective lens, to generate "binocular" or "stereoscopic" vision for viewing by a user. However, providing a head-mounted device (HMD) that is compact, lightweight with sufficiently bright and high-resolution images remains a constant challenge.

BRIEF DESCRIPTION OF DRAWINGS

Features of the present disclosure are illustrated by way of example and not limited in the following figures, in which like numerals indicate like elements. One skilled in the art will readily recognize from the following that alternative examples of the structures and methods illustrated in the figures can be employed without departing from the principles described herein.

FIGS. 3A-3D illustrate cross-sectional views of a color-separated liquid crystal display (LCD) with white light and laser backlight, according to an example.

FIG. 6 illustrates a configuration using a phase plate with conjugate beam to generate illumination patterns at a liquid crystal display (LCD), according to an example.

DETAILED DESCRIPTION

Figure 1:
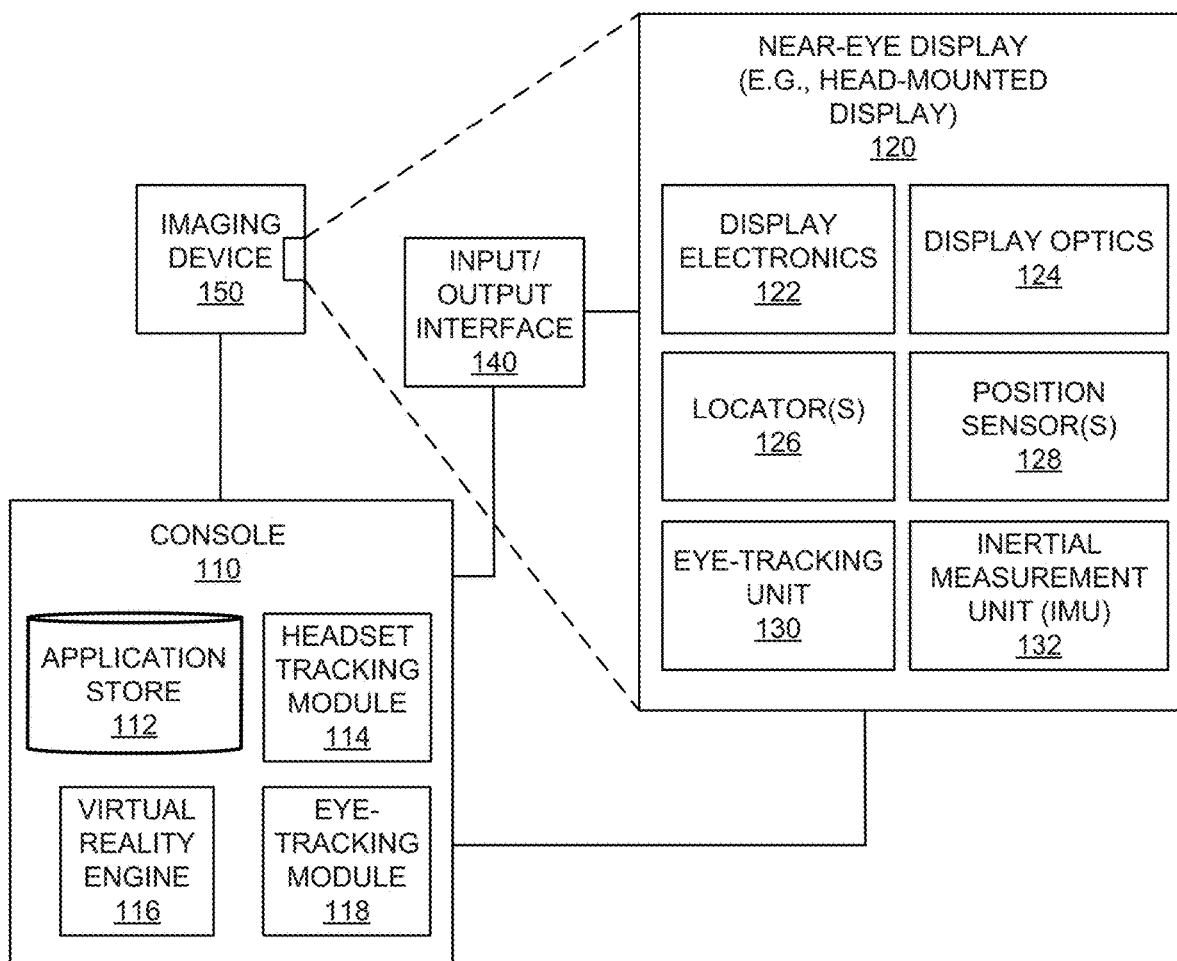
FIG. 1 illustrates a block diagram of an artificial reality system environment including a near-eye display, according to an example.

For simplicity and illustrative purposes, the present application is described by referring mainly to examples thereof. In the following description, numerous specific details are set forth in order to provide a thorough understanding of the present application. It will be readily apparent, however, that the present application may be practiced without limitation to these specific details. In other instances, some methods and structures readily understood by one of ordinary skill in the art have not been described in detail so as not to unnecessarily obscure the present application. As used herein, the terms "a" and "an" are intended to denote at least one of a particular element, the term "includes" means includes but not limited to, the term "including" means including but not limited to, and the term "based on" means based at least in part on.

Some display systems, such as, VR-based head-mounted devices (HMDs) and/or eyewear devices, provide an immersive, stereoscopic visual experience. In some conventional displays, however, light transmissivity (or lack thereof) may present issues. For instance, in a traditional liquid crystal display (LCD), such as those used in such VR-based HMDs, a significant amount of light may be lost through the various optical layers that form the overall display. In many ways, this may be referred to as "wall-plug efficiency" of an LCD. The systems and methods described herein may provide phase plate solution and fabrication method for color-separated laser backlight in a display system, such as VR-based head-mounted devices (HMDs).

In some examples, a phase plate for a liquid crystal display (LCD) stack may be fabricated by providing an interferometer system to generate a hologram of pinholes, where the interferometer system may include a transparent substrate for photopolymer layer attachment, a photopolymer layer, and an exposure mask with the pinholes. The photopolymer layer may be exposed to a collimated laser light through the exposure mask with the collimated light passing through the exposure mask itself to create a collimated beam and the pinholes to create a spherical wavefront. The collimated beam and the spherical wavefront may generate the hologram. Pinhole placement may be iteratively shifted for repeated exposure of the photopolymer layer with the collimated light for additional wavelengths. The phase plate may be used to focus red, green, and blue components of the light from the backlight source onto respective red, green, and blue subpixels of a thin-film-transistor (TFT) layer of the liquid crystal display (LCD) stack.

A liquid crystal display (LCD) device is used as an example platform for use of a phase plate herein. liquid crystal display (LCD) displays may include any number of liquid crystal display (LCD) cells such as a nematic liquid crystal (LC) cell, a nematic liquid crystal (LC) cell with chiral dopants, a chiral liquid crystal (LC) cell, a uniform lying helix (ULH) liquid crystal (LC) cell, a ferroelectric liquid crystal (LC) cell, or the like. In other examples, the liquid crystal (LC) cell may also include an electrically drivable birefringence material or other similar material.

Further examples of display devices may include a light emitting diode (LED) display, an organic light emitting diode (OLED) display, an active-matrix organic light-emitting diode (AMOLED) display, micro light emitting diode (micro-LED) display, some other display, or some combination thereof.

FIG. 1 illustrates a block diagram of an artificial reality system environment 100 including a near-eye display, according to an example. As used herein, a "near-eye display" may refer to a device (e.g., an optical device) that may be in close proximity to a user's eye. As used herein, "artificial reality" may refer to aspects of, among other things, a "metaverse" or an environment of real and virtual elements and may include use of technologies associated with virtual reality (VR), augmented reality (AR), and/or mixed reality (MR). As used herein a "user" may refer to a user or wearer of a "near-eye display."

As shown in FIG. 1, the artificial reality system environment 100 may include a near-eye display 120, an optional external imaging device 150, and an optional input/output interface 140, each of which may be coupled to a console 110. The console 110 may be optional in some instances as the functions of the console 110 may be integrated into the near-eye display 120. In some examples, the near-eye display 120 may be a head-mounted display (HMD) that presents content to a user.

In some instances, for a near-eye display system, it may generally be desirable to expand an eyebox, reduce display haze, improve image quality (e.g., resolution and contrast), reduce physical size, increase power efficiency, and increase or expand field of view (FOV). As used herein, "field of view" (FOV) may refer to an angular range of an image as seen by a user, which is typically measured in degrees as observed by one eye (for a monocular HMD) or both eyes (for binocular HMDs). Also, as used herein, an "eyebox" may be a two-dimensional box that may be positioned in front of the user's eye from which a displayed image from an image source may be viewed.

In some examples, in a near-eye display system, light from a surrounding environment may traverse a "see-through" region of a waveguide display (e.g., a transparent substrate) to reach a user's eyes. For example, in a near-eye display system, light of projected images may be coupled into a transparent substrate of a waveguide, propagate within the waveguide, and be coupled or directed out of the waveguide at one or more locations to replicate exit pupils and expand the eyebox.

In some examples, the near-eye display 120 may include one or more rigid bodies, which may be rigidly or non-rigidly coupled to each other. In some examples, a rigid coupling between rigid bodies may cause the coupled rigid bodies to act as a single rigid entity, while in other examples, a non-rigid coupling between rigid bodies may allow the rigid bodies to move relative to each other.

In some examples, the near-eye display 120 may be implemented in any suitable form-factor, including a head-mounted display (HMD), a pair of glasses, or other similar wearable eyewear or device. Examples of the near-eye display 120 are further described below with respect to FIGS. 2 and 3. Additionally, in some examples, the functionality described herein may be used in a head-mounted display (HMD) or headset that may combine images of an environment external to the near-eye display 120 and artificial reality content (e.g., computer-generated images). Therefore, in some examples, the near-eye display 120 may augment images of a physical, real-world environment external to the near-eye display 120 with generated and/or overlayed digital content (e.g., images, video, sound, etc.) to present an augmented reality to a user.

In some examples, the near-eye display 120 may include any number of display electronics 122, display optics 124, and an eye-tracking unit 130. In some examples, the near-eye display 120 may also include one or more locators 126, one or more position sensors 128, and an inertial measurement unit (IMU) 132. In some examples, the near-eye display 120 may omit any of the eye-tracking unit 130, the one or more locators 126, the one or more position sensors 128, and the inertial measurement unit (IMU) 132, or may include additional elements.

In some examples, the display electronics 122 may display or facilitate the display of images to the user according to data received from, for example, the optional console 110. In some examples, the display electronics 122 may include one or more display panels. In some examples, the display electronics 122 may include any number of pixels to emit light of a predominant color such as red, green, blue, white, or yellow. In some examples, the display electronics 122 may display a three-dimensional (3D) image, e.g., using stereoscopic effects produced by two-dimensional panels, to create a subjective perception of image depth.

In some examples, the display optics 124 may display image content optically (e.g., using optical waveguides and/or couplers) or magnify image light received from the display electronics 122, correct optical errors associated with the image light, and/or present the corrected image light to a user of the near-eye display 120. In some examples, the display optics 124 may include a single optical element or any number of combinations of various optical elements as well as mechanical couplings to maintain relative spacing and orientation of the optical elements in the combination. In some examples, one or more optical elements in the display optics 124 may have an optical coating, such as an anti-reflective coating, a reflective coating, a filtering coating, and/or a combination of different optical coatings.

In some examples, the display optics 124 may also be designed to correct one or more types of optical errors, such as two-dimensional optical errors, three-dimensional optical errors, or any combination thereof. Examples of two-dimensional errors may include barrel distortion, pincushion distortion, longitudinal chromatic aberration, and/or transverse chromatic aberration. Examples of three-dimensional errors may include spherical aberration, chromatic aberration field curvature, and astigmatism.

In some examples, the one or more locators 126 may be objects located in specific positions relative to one another and relative to a reference point on the near-eye display 120. In some examples, the optional console 110 may identify the one or more locators 126 in images captured by the optional external imaging device 150 to determine the artificial reality headset's position, orientation, or both. The one or more locators 126 may each be a light-emitting diode (LED), a corner cube reflector, a reflective marker, a type of light source that contrasts with an environment in which the near-eye display 120 operates, or any combination thereof.

In some examples, the external imaging device 150 may include one or more cameras, one or more video cameras, any other device capable of capturing images including the one or more locators 126, or any combination thereof. The optional external imaging device 150 may be configured to detect light emitted or reflected from the one or more locators 126 in a field of view of the optional external imaging device 150.

In some examples, the one or more position sensors 128 may generate one or more measurement signals in response to motion of the near-eye display 120. Examples of the one or more position sensors 128 may include any number of accelerometers, gyroscopes, magnetometers, and/or other motion-detecting or error-correcting sensors, or any combination thereof.

In some examples, the inertial measurement unit (IMU) 132 may be an electronic device that generates fast calibration data based on measurement signals received from the one or more position sensors 128. The one or more position sensors 128 may be located external to the inertial measurement unit (I M U) 132, internal to the inertial measurement unit (I M U) 132, or any combination thereof. Based on the one or more measurement signals from the one or more position sensors 128, the inertial measurement unit (IMU) 132 may generate fast calibration data indicating an estimated position of the near-eye display 120 that may be relative to an initial position of the near-eye display 120. For example, the inertial measurement unit (IMU) 132 may integrate measurement signals received from accelerometers over time to estimate a velocity vector and integrate the velocity vector over time to determine an estimated position of a reference point on the near-eye display 120. Alternatively, the inertial measurement unit (IMU) 132 may provide the sampled measurement signals to the optional console 110, which may determine the fast calibration data.

The eye-tracking unit 130 may include one or more eye-tracking systems. As used herein, "eye tracking" may refer to determining an eye's position or relative position, including orientation, location, and/or gaze of a user's eye. In some examples, an eye-tracking system may include an imaging system that captures one or more images of an eye and may optionally include a light emitter, which may generate light that is directed to an eye such that light reflected by the eye may be captured by the imaging system. In other examples, the eye-tracking unit 130 may capture reflected radio waves emitted by a miniature radar unit. These data associated with the eye may be used to determine or predict eye position, orientation, movement, location, and/or gaze.

In some examples, the near-eye display 120 may use the orientation of the eye to introduce depth cues (e.g., blur image outside of the user's main line of sight), collect heuristics on the user interaction in the virtual reality (VR) media (e.g., time spent on any particular subject, object, or frame as a function of exposed stimuli), some other functions that are based in part on the orientation of at least one of the user's eyes, or any combination thereof. In some examples, because the orientation may be determined for both eyes of the user, the eye-tracking unit 130 may be able to determine where the user is looking or predict any user patterns, etc.

In some examples, the input/output interface 140 may be a device that allows a user to send action requests to the optional console 110. As used herein, an "action request" may be a request to perform a particular action. For example, an action request may be to start or to end an application or to perform a particular action within the application. The input/output interface 140 may include one or more input devices. Example input devices may include a keyboard, a mouse, a game controller, a glove, a button, a touch screen, or any other suitable device for receiving action requests and communicating the received action requests to the optional console 110. In some examples, an action request received by the input/output interface 140 may be communicated to the optional console 110, which may perform an action corresponding to the requested action.

In some examples, the optional console 110 may provide content to the near-eye display 120 for presentation to the user in accordance with information received from one or more of external imaging device 150, the near-eye display 120, and the input/output interface 140. For example, in the example shown in FIG. 1, the optional console 110 may include an application store 112, a headset tracking module 114, a virtual reality engine 116, and an eye-tracking module 118. Some examples of the optional console 110 may include different or additional modules than those described in conjunction with FIG. 1. Functions further described below may be distributed among components of the optional console 110 in a different manner than is described here.

In some examples, the optional console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random-access memory (DRAM)). In some examples, the modules of the optional console 110 described in conjunction with FIG. 1 may be encoded as instructions in the non-transitory computer-readable storage medium that, when executed by the processor, cause the processor to perform the functions further described below. It should be appreciated that the optical console 110 may or may not be needed or the optional console 110 may be integrated with or separate from the near-eye display 120.

In some examples, the application store 112 may store one or more applications for execution by the optional console 110. An application may include a group of instructions that, when executed by a processor, generates content for presentation to the user. Examples of the applications may include gaming applications, conferencing applications, video playback application, or other suitable applications.

In some examples, the headset tracking module 114 may track movements of the near-eye display 120 using slow calibration information from the external imaging device 150. For example, the headset tracking module 114 may determine positions of a reference point of the near-eye display 120 using observed locators from the slow calibration information and a model of the near-eye display 120. Additionally, in some examples, the headset tracking module 114 may use portions of the fast calibration information, the slow calibration information, or any combination thereof, to predict a future location of the near-eye display 120. In some examples, the headset tracking module 114 may provide the estimated or predicted future position of the near-eye display 120 to the virtual reality engine 116.

In some examples, the virtual reality engine 116 may execute applications within the artificial reality system environment 100 and receive position information of the near-eye display 120, acceleration information of the near-eye display 120, velocity information of the near-eye display 120, predicted future positions of the near-eye display 120, or any combination thereof from the headset tracking module 114. In some examples, the virtual reality engine 116 may also receive estimated eye position and orientation information from the eye-tracking module 118. Based on the received information, the virtual reality engine 116 may determine content to provide to the near-eye display 120 for presentation to the user.

In some examples, the eye-tracking module 118 may receive eye-tracking data from the eye-tracking unit 130 and determine the position of the user's eye based on the eye tracking data. In some examples, the position of the eye may include an eye's orientation, location, or both relative to the near-eye display 120 or any element thereof. So, in these examples, because the eye's axes of rotation change as a function of the eye's location in its socket, determining the eye's location in its socket may allow the eye-tracking module 118 to more accurately determine the eye's orientation.

In some examples, a location of a projector of a display system may be adjusted to enable any number of design modifications. For example, in some instances, a projector may be located in front of a viewer's eye (i.e., "front-mounted" placement). In a front-mounted placement, in some examples, a projector of a display system may be located away from a user's eyes (i.e., "world-side"). In some examples, a head-mounted display (HMD) device may utilize a front-mounted placement to propagate light towards a user's eye(s) to project an image.

Figure 2:
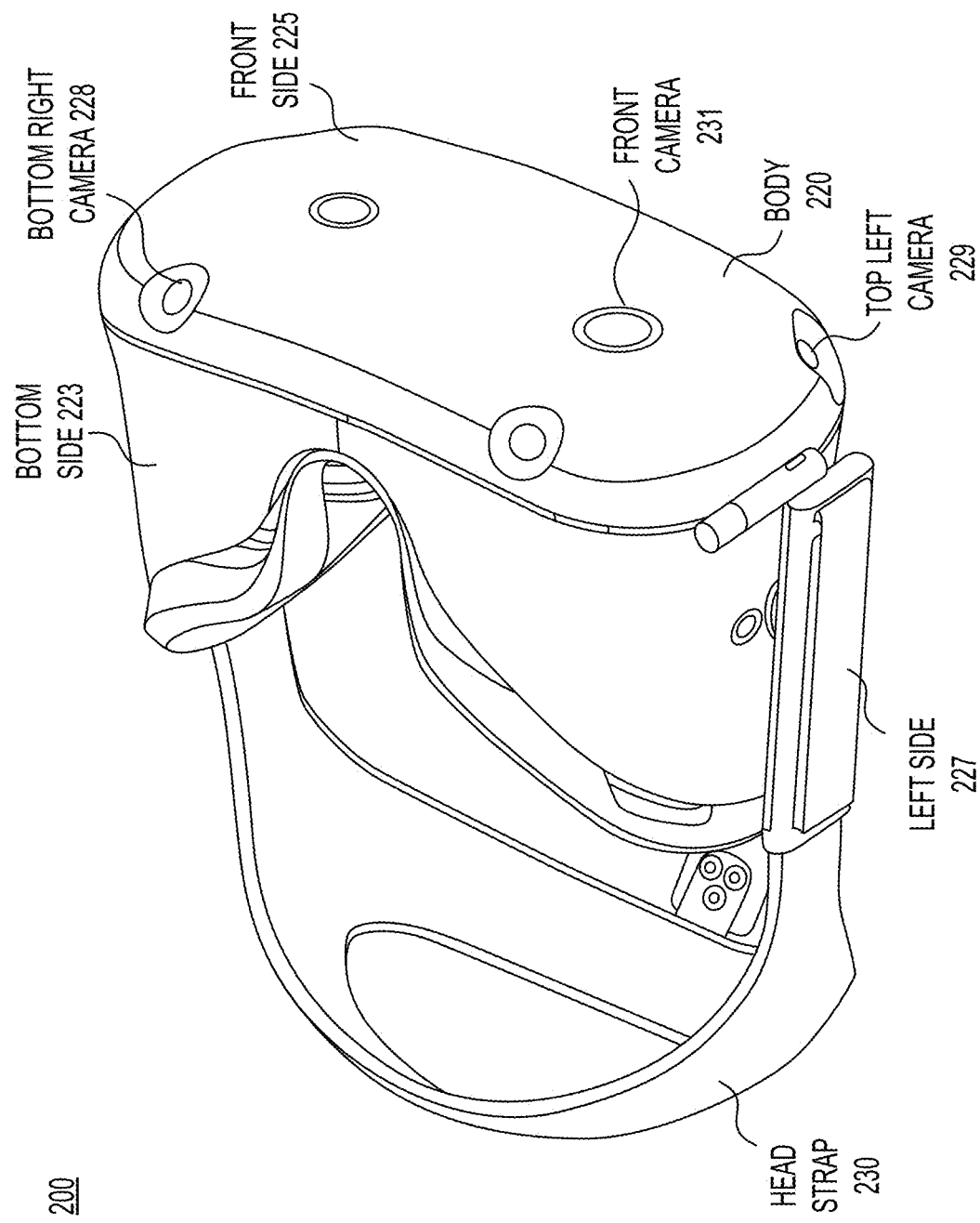
FIG. 2 illustrates a perspective view of a near-eye display in the form of a head-mounted display (HMD) device, according to an example.

FIG. 2 illustrates a perspective view of a near-eye display in the form of a head-mounted display (HMD) device 200, according to an example. In some examples, the head-mounted display (HMD) device 200 may be a part of a virtual reality (VR) system, an augmented reality (AR) system, a mixed reality (MR) system, another system that uses displays or wearables, or any combination thereof. In some examples, the head-mounted display (HMD) device 200 may include a body 220 and a head strap 230. FIG. 2 shows a bottom side 223, a front side 225, and a left side 227 of the body 220 in the perspective view. In some examples, the head-mounted display (HMD) device 200 may also include external cameras on the top/bottom/left/right/front exterior, such as bottom right camera 228, top left camera 229, and front camera 231, as shown. In some examples, the head strap 230 may have an adjustable or extendible length. In particular, in some examples, there may be a sufficient space between the body 220 and the head strap 230 of the head-mounted display (HMD) device 200 for allowing a user to mount the head-mounted display (HMD) device 200 onto the user's head. In some examples, the head-mounted display (HMD) device 200 may include additional, fewer, and/or different components.

In some examples, the head-mounted display (HMD) device 200 may present to a user, media or other digital content including virtual and/or augmented views of a physical, real-world environment with computer-generated elements. Examples of the media or digital content presented by the head-mounted display (HMD) device 200 may include images (e.g., two-dimensional (2D) or three-dimensional (3D) images), videos (e.g., 2D or 3D videos), audio, or any combination thereof. In some examples, the images and videos may be presented to each eye of a user by one or more display assemblies (not shown in FIG. 2) enclosed in the body 220 of the head-mounted display (HMD) device 200.

In some examples, the head-mounted display (HMD) device 200 may include various sensors (not shown), such as depth sensors, motion sensors, position sensors, and/or eye tracking sensors. Some of these sensors may use any number of structured or unstructured light patterns for sensing purposes. In some examples, the head-mounted display (HMD) device 200 may include an input/output interface 140 for communicating with a console 110, as described with respect to FIG. 1. In some examples, the head-mounted display (HMD) device 200 may include a virtual reality engine (not shown), but similar to the virtual reality engine 116 described with respect to FIG. 1, that may execute applications within the head-mounted display (HMD) device 200 and receive depth information, position information, acceleration information, velocity information, predicted future positions, or any combination thereof of the head-mounted display (HMD) device 200 from the various sensors.

In some examples, the information received by the virtual reality engine 116 may be used for producing a signal (e.g., display instructions) to the one or more display assemblies. In some examples, the head-mounted display (HMD) device 200 may include locators (not shown), but similar to the virtual locators 126 described in FIG. 1, which may be located in fixed positions on the body 220 of the head-mounted display (HMD) device 200 relative to one another and relative to a reference point. Each of the locators may emit light that is detectable by an external imaging device. This may be useful for the purposes of head tracking or other movement/orientation. It should be appreciated that other elements or components may also be used in addition or in lieu of such locators.

It should be appreciated that in some examples, a projector mounted in a display system may be placed near and/or closer to a user's eye (i.e., "eye-side"). In some examples, and as discussed herein, a projector for a display system shaped liked eyeglasses may be mounted or positioned in a temple arm (i.e., a top far corner of a lens side) of the eyeglasses. It should be appreciated that, in some instances, utilizing a back-mounted projector placement may help to reduce size or bulkiness of any required housing required for a display system, which may also result in a significant improvement in user experience for a user.

As mentioned above, light transmissivity (or lack thereof) may present issues in some display systems, such as VR-based head-mounted devices (HMDs) and/or eyewear devices. Low light transmissivity may limit brightness and minimize a user's desired immersive visual experience. Thus, the systems and methods described herein may help improve "wall-plug efficiency" of liquid crystal displays (LCDs).

Figure 3A:
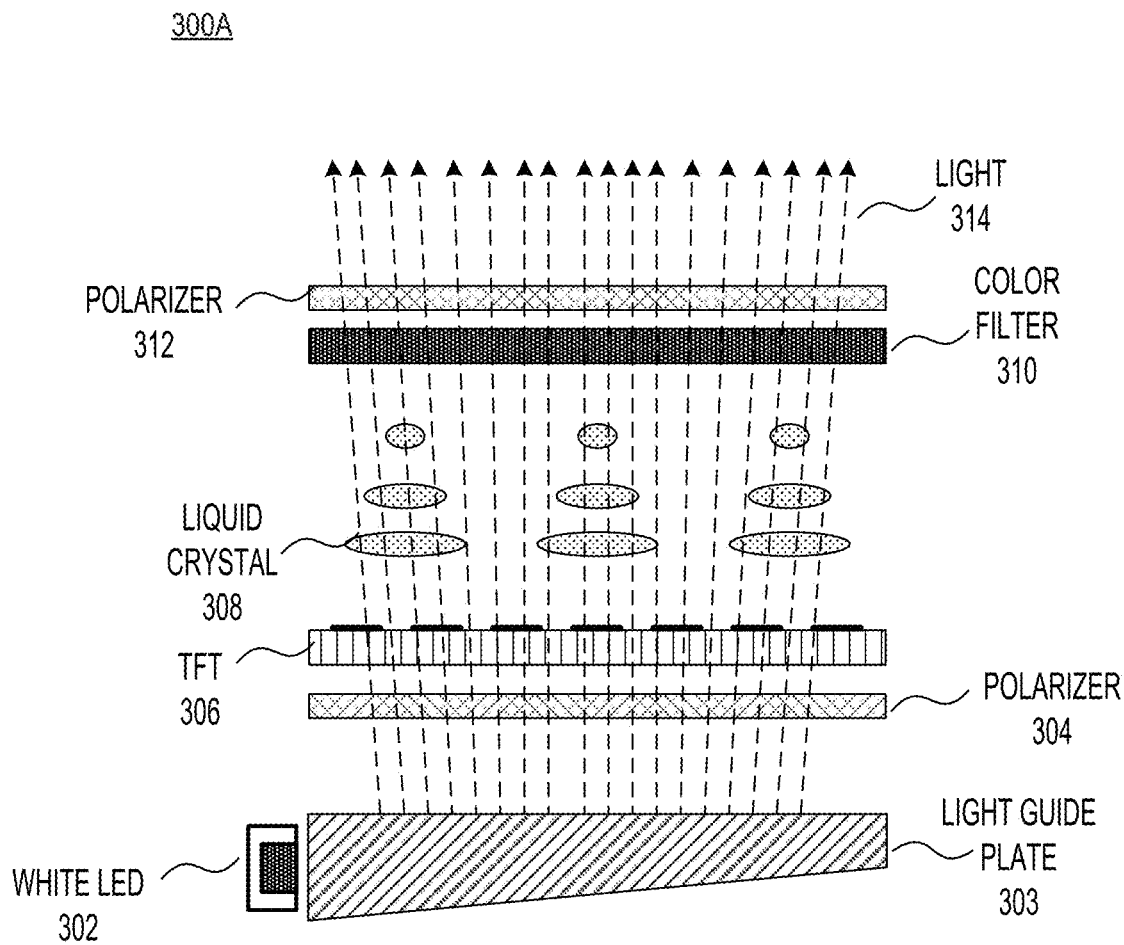

FIGS. 3A-3D illustrate cross-sectional views of a color-separated liquid crystal display (LCD) with white light and laser backlight, according to an example. Diagram 300A in FIG. 3A illustrates various layers that form an LCD stack with a white light-based backlight. As shown in diagram 300A, the LCD stack may include a white LED 302 backlight that transmits light through light plate guide 303 to any number of optical components, such as one or more polarizers (e.g., polarizer 304 and polarizer 312), a thin film transistor (TFT) layer 306, a liquid crystal (LC) layer 308, a color filter (CF) 310, etc.

In some examples, the light guide plate 303 may direct and spread the white light from the LED to polarizer 304, which may allow certain wavelengths of light while blocking others. The pixels in an liquid crystal display (LCD) project a specific level of brightness to create a visible image. With liquid crystal displays (LCDs) including millions of pixels, to create an image, many of these pixels may need varying levels of brightness. Some of the pixels, for example, may need to be brighter than others. Through the polarizer 304 (and polarizer 312), the brightness of the pixels may be controlled, resulting in the production of high-quality and visible images. The thin film transistor (TFT) layer 306, formed by thin field effect transistors (FETs) grown on a glass or similar substrate, may control electrical charges that align different crystals of the liquid crystal (LC) layer 308. The color filter (CF) 310 may select which colors are displayed. Thus, the thin film transistor (TFT) layer 306 may control light flow, while the color filter (CF) 310 may control colors.

As shown in the diagram, when light 314 passes through the LCD stack, each of the layers may reduce the amount of light passing through it in some capacity. For example, the light plate guide 303 may pass up to 70% of light through. The polarizer 304 may pass up to 45% of light through. The thin film transistor (TFT) layer 306 may pass up to 30% of light through. The liquid crystal (LC) layer 308 may pass up to 60% of light through. The color filter (CF) 310 may pass up to 30% of light through. Additionally, the polarizer 312 may pass up to 90% of light through. When calculated, the amount of light that actually gets transmitted by the LCD stack may be only a small fraction of light provided by the white LED 302. By some estimates, the light transmissivity for an LCD display may be approximately 0.0945 transmissivity (9.45%) or less than 10%.

Accordingly, one of the primary goals of the systems and methods described herein is to improve light transmissivity in the LCD stack and to provide increased brightness, visual acuity, and higher quality images in virtual reality (VR), augmented reality (AR), mixed reality (MR) head-mounted display (HMD) devices. One approach to help minimize light loss may be to use an alternative light source or configuration.

Figure 3B:
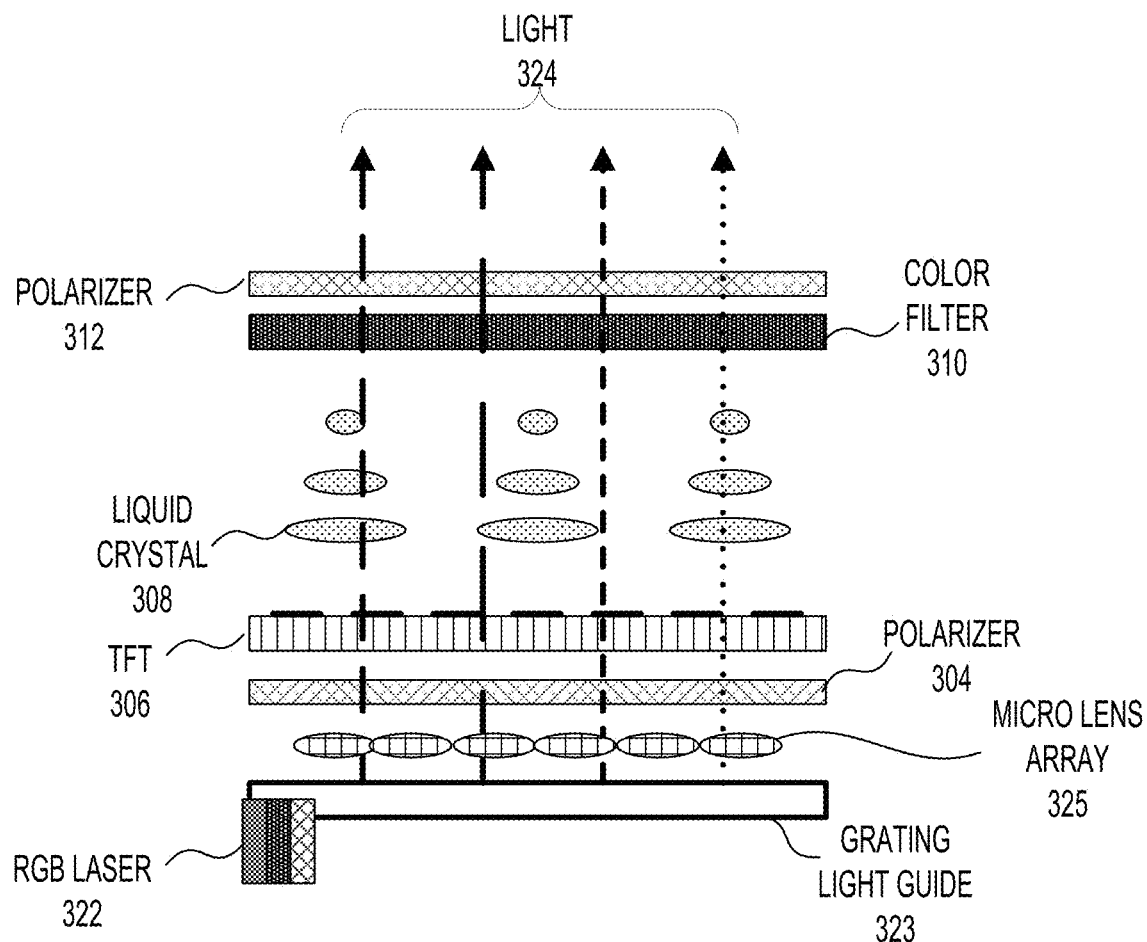

Diagram 300B in FIG. 3B illustrates various layers that form an LCD stack with a laser-based backlight. As shown in diagram 300B, the LCD stack may include a red-green-blue (RGB) laser 322 backlight that transmits light through grating light guide 323 to any number of optical components, such as a micro lens array (MLA) 325, one or more polarizers (e.g., polarizer 304 and polarizer 312), a thin film transistor (TFT) layer 306, a liquid crystal (LC) layer 308, a color filter (CF) 310, etc.

Micro lens arrays (MLAs) may include multiple small lenses (generally with a diameter less than a millimeter and often as small as 10 micrometres) formed in a one-dimensional or two-dimensional array on a supporting substrate. A micro lens array (MLA) may focus the light beam through the aperture, thus boosting the overall transmission.

As shown in the diagram, when light 324 passes through the LCD stack, each of the layers may reduce the amount of light passing through it in some capacity. For example, the grating light guide 323 may pass up to 70% of light through. The micro lens array (MLA) 325 may pass up to 50% of light through. The polarizer 304 may pass up to 90% of light through. The thin film transistor (TFT) layer 306 may pass up to 50% of light through. The liquid crystal (LC) layer 308 may pass up to 60% of light through. The color filter (CF) 310 may pass up to 100% of light through. Additionally, the polarizer 312 may pass up to 90% of light through. When calculated, the amount of light that actually gets transmitted by the LCD stack with a red-green-blue (RGB) laser 322 backlight and micro lens array (MLA) may be a small fraction of light provided by the red-green-blue (RGB) laser 322 backlight but about 50% more compared to an LCD stack with white LED 302 backlight. By some estimates, the light transmissivity for an LCD display may be approximately 0.1575 transmissivity (15.45%), which represents substantial improvement over white LED backlight systems.

Figure 3C:
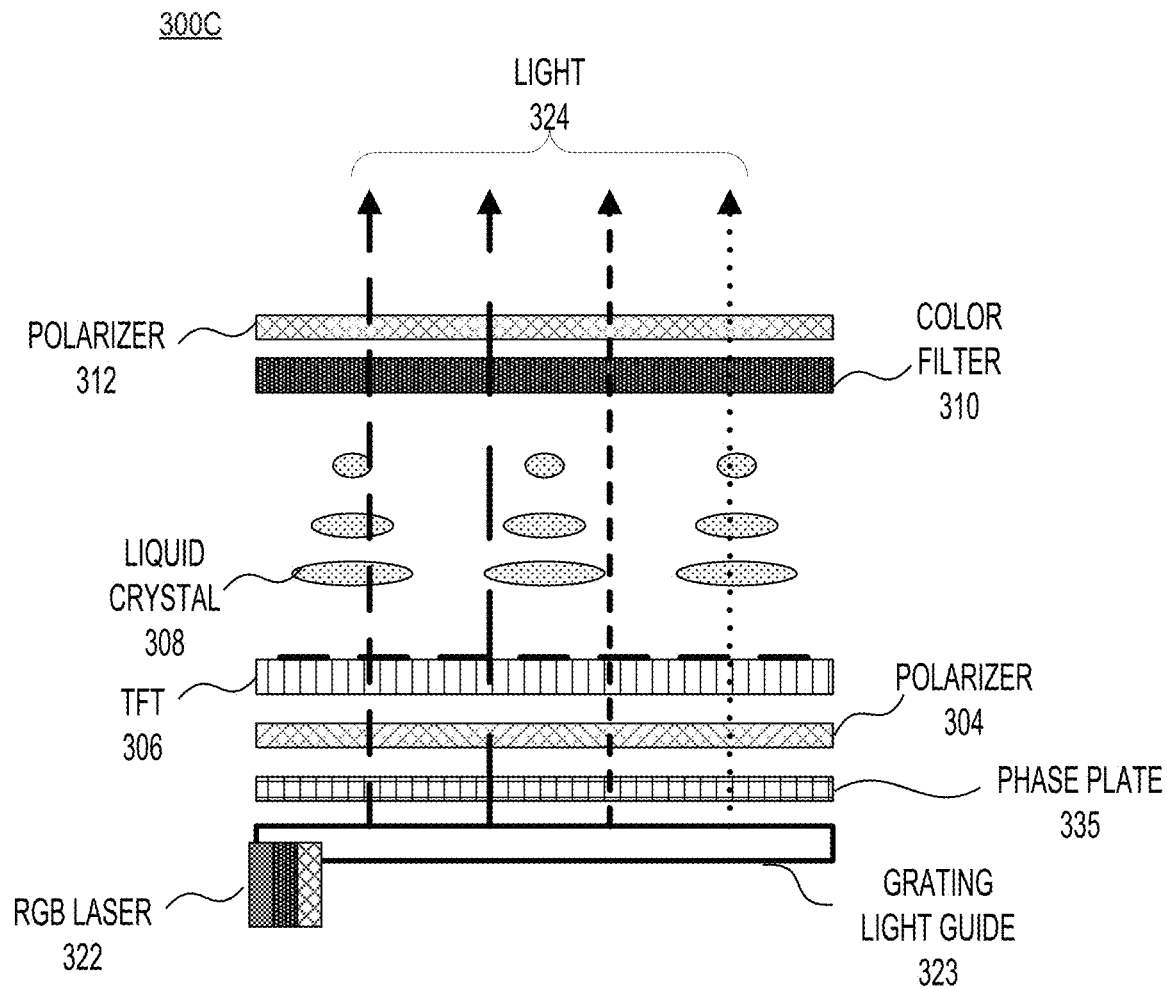

Diagram 300C in FIG. 3C illustrates various layers that form an LCD stack with a laser-based backlight. As shown in diagram 300C, the LCD stack may include a red-green-blue (RGB) laser 322 backlight that transmits light through grating light guide 323 to any number of optical components, such as a phase plate 335, one or more polarizers (e.g., polarizer 304 and polarizer 312), a thin film transistor (TFT) layer 306, a liquid crystal (LC) layer 308, a color filter (CF) 310, etc.

A phase plate is a transparent plate of double refracting material that changes the relative phase of the components of polarized light passing through the phase plate. The use of a phase plate may also focus the light beam through the aperture, thereby boosting the overall transmission at even greater efficiency than the micro lens array (MLA) layer. Examples of photopolymer materials may include, but are not limited to, thermoplastic photopolymer films and polycarbonate films.

As shown in the diagram, when light 324 passes through the LCD stack, each of the layers may reduce the amount of light passing through it in some capacity. For example, the grating light guide 323 may pass up to 70% of light through. The phase plate 335 may pass up to 60% of light through. The polarizer 304 may pass up to 90% of light through. The thin film transistor (TFT) layer 306 may pass more than 60% of light through. The liquid crystal (LC) layer 308 may pass up to 60% of light through. The color filter (CF) 310 may pass up to 100% of light through. Additionally, the polarizer 312 may pass up to 90% of light through. When calculated, the amount of light that actually gets transmitted by the LCD stack with a phase plate 335 and a red-green-blue (RGB) laser 322 backlight may have a light transmissivity of approximately 0.2268 (22.68%), which represents substantial improvement over white LED backlight and laser backlight systems with micro lens arrays.

Diagram 300D in FIG. 3D illustrates various layers that form an LCD stack with a laser-based backlight. As shown in diagram 300D, the LCD stack may include a red-green-blue (RGB) laser 342 backlight that transmits light through waveguide 344 to any number of optical components, such as a color selective micro lens array (MLA) 346 and a liquid crystal (LC) panel 348 with embedded thin film transistor (TFT) layer and a black matrix layer, etc.

In the shown configuration, the black matrix (BM) layer may actually contain the thin film transistor (TFT) layer as part of it and increase a contrast of the images from the liquid crystal (LC) panel 348. In some examples, the black matrix (BM) layer may be formed on the liquid crystal (LC) layer through wet-etch lithography. The color selective micro lens array (MLA) configuration with TFT/BM embedded liquid crystal (LC) panel may increase light transmissivity of the LCD stack 50 over 50%.

Figure 4A:
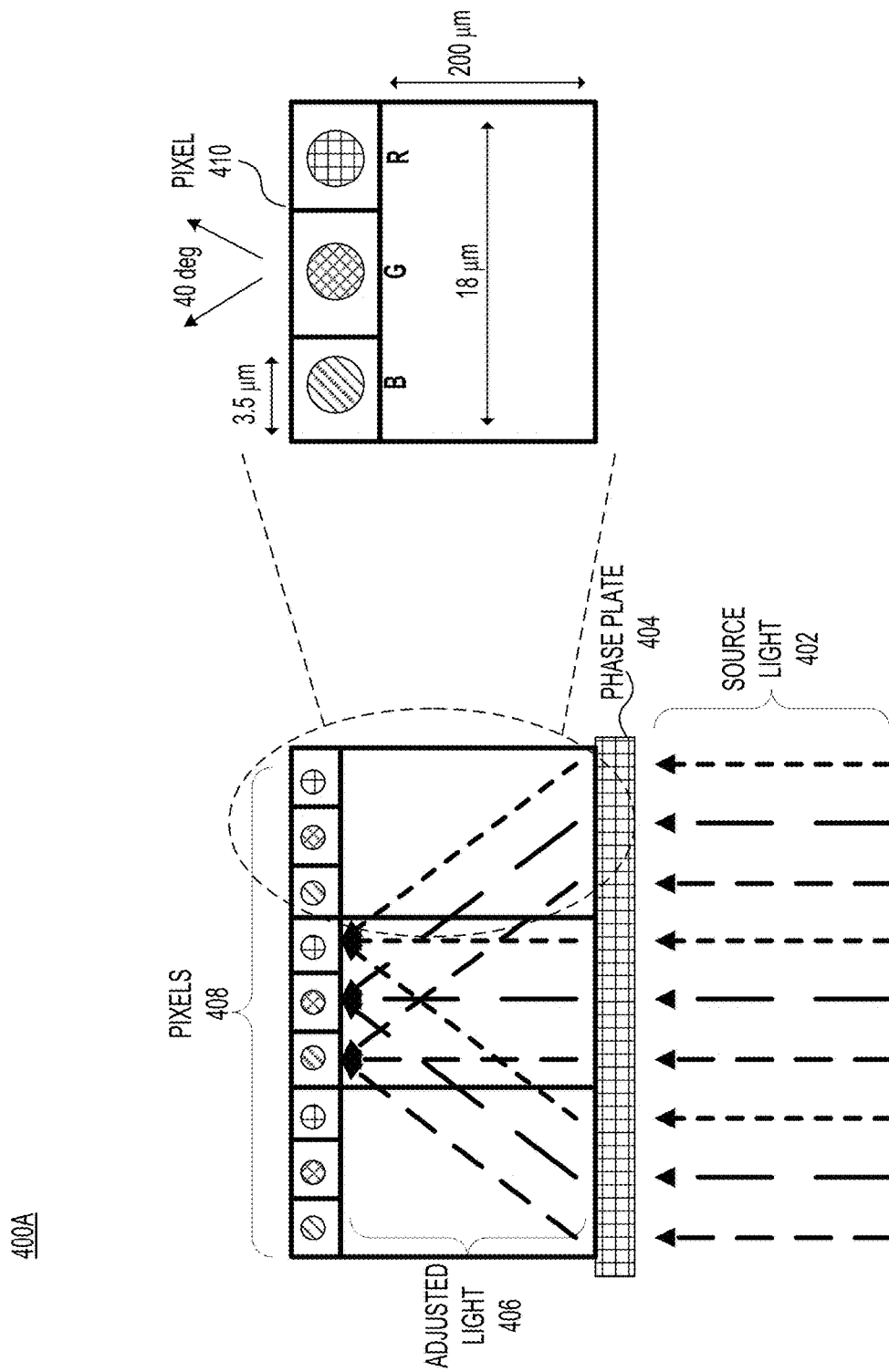
FIGS. 4A-4D illustrate a cross-sectional pixel-level view of a color-separated liquid crystal display (LCD) with laser backlight and a phase plate, according to an example.
Figure 4B:
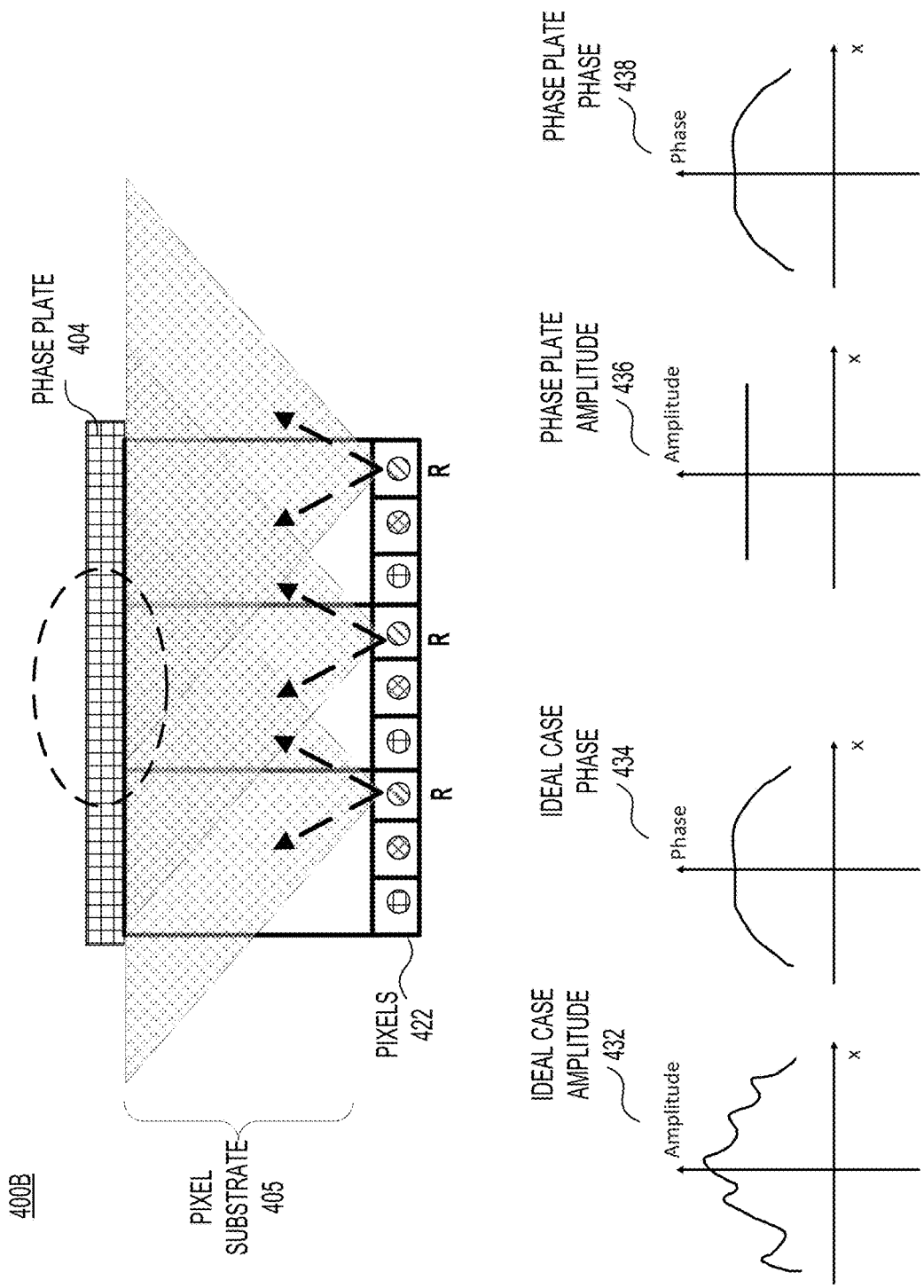

FIGS. 4A-4D illustrate a cross-sectional pixel-level view of a color-separated liquid crystal display (LCD) with laser backlight and a phase plate, according to an example. Diagram 400A in FIG. 4A shows source light 402 being adjusted by a phase plate 404. As mentioned herein, the phase plate 404 may change the relative phase of the components of polarized light passing through the phase plate and also focus the light. Thus, adjusted light 406 may be focused on selected pixels 408 such that blue light components focus on a blue subpixel, red light components focus on a red subpixel, and green light components focus on a green subpixel.

In some examples, a pixel 410 (including blue, green, and red subpixels) may have a width of approximately 18 micrometers (μm) with each of the pinholes associated with each of the RGB colors having a diameter of approximately 3.5 μm. In practical implementations, the pixel width may be within a range of about 10-25 μm and the pinhole diameter may be within a range of about 2-5 μm. For the illustrated configuration to operate with high efficiency, the light may be arranged to pass in a cone-like shape at approximately 40 degrees, as shown. In some examples, the the display emission full angle (cone-like shape) may be in a range from about 20 degrees (relatively collimated) to about 90 degrees (Lambersian) depending on an application. Furthermore, in some examples, the overall height of the substrate (e.g., glass) for the pixel layer may be in a range of about 200-500 μm. Further examples, of substrates may include Lithium Niobate, silicon carbide, and similar materials. Using these parameters, the liquid crystal display (LCD) with laser backlight and phase plate may provide particular responses for wavelengths associated with each of the three colors (red, green, and/or blue).

In case of the micro lens array (MLA) configuration (FIG. 3B), to achieve the 40-degree the micro lens array (MLA) may need a focal length of about 20-30 μm, which may be too short for practical implementations. Example configurations incorporating the phase plate 404, on the other hand, may realize both long focal length (e.g., about or greater than 200 μm) as well as the full angle of about 40 degrees.

In some examples, the phase plate 404 may be designed based on time reversal computation. The configurations in FIGS. 4A-4D are shown in reverse order (i.e., with the phase plate on top and pixel layer (pixels 422) at the bottom) to illustrate the time reversal computation. For the computation, it may be assumed to have a point source at the subpixel locations and the point sources may be assumed to emit light. The emissions from the point sources would interfere as the light passes through the pixel substrate 405 (e.g., glass), and create the light patterns between the pixel layer and the phase plate as shown in diagram 400B of FIG. 4B for the red subpixels (diagram 400C for the green subpixels and diagram 400D for the blue subpixels). A response of the phase plate 404 may be determined by this interference between multiple sources. Thus, the phase plate 404 may be designed to provide an amplitude and a phase for the light provided to the pixel layer (pixels 422) allowing maximum light at the pixel layer for each type of subpixel. Diagram 400B also shows an ideal case for the amplitude 432 and for the phase 434 for red subpixel in comparison with a relatively constant amplitude 436 provided by the phase plate 404 and a phase 438 curve that substantially matches the ideal case.

Figure 4C:
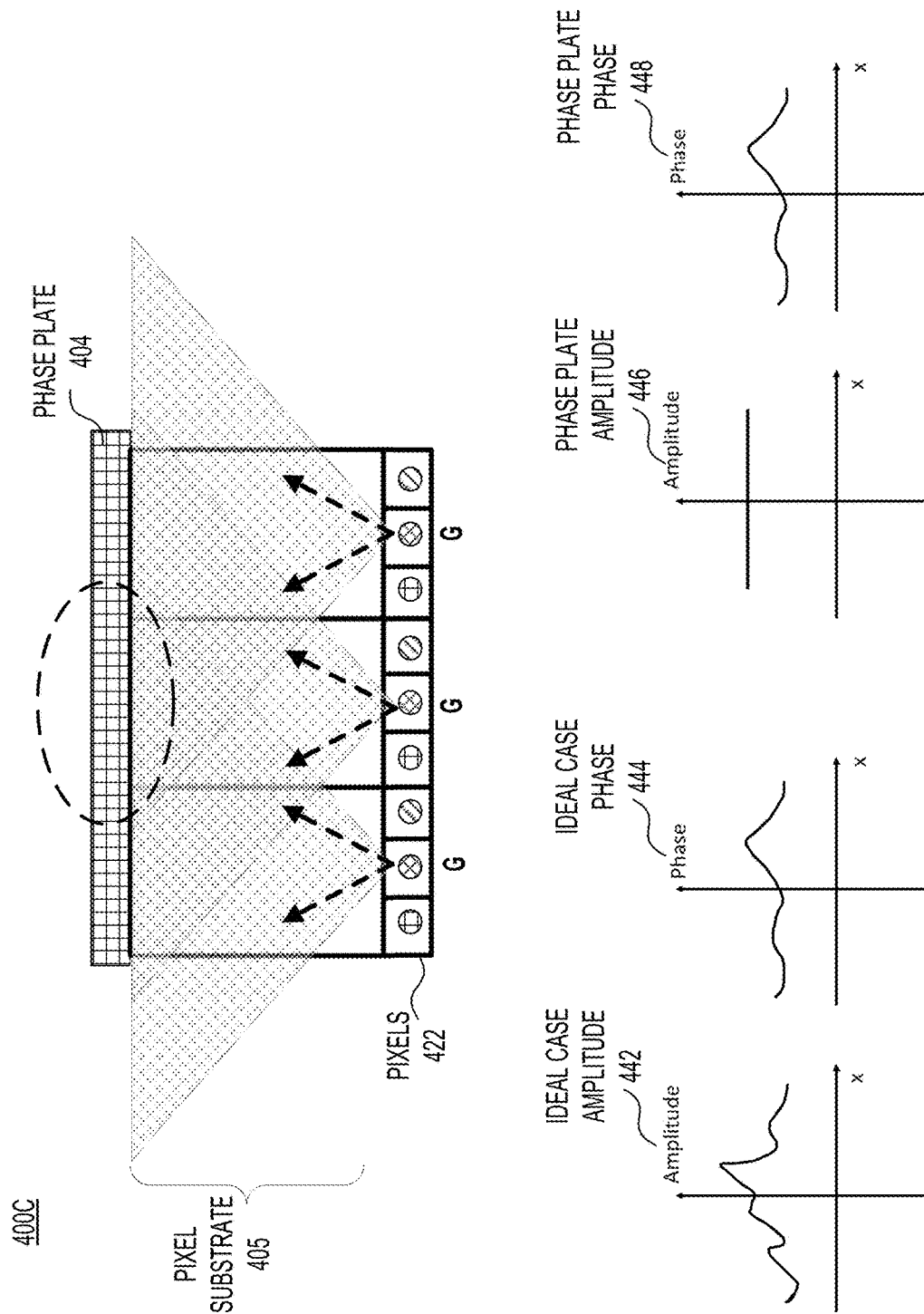
Figure 4D:
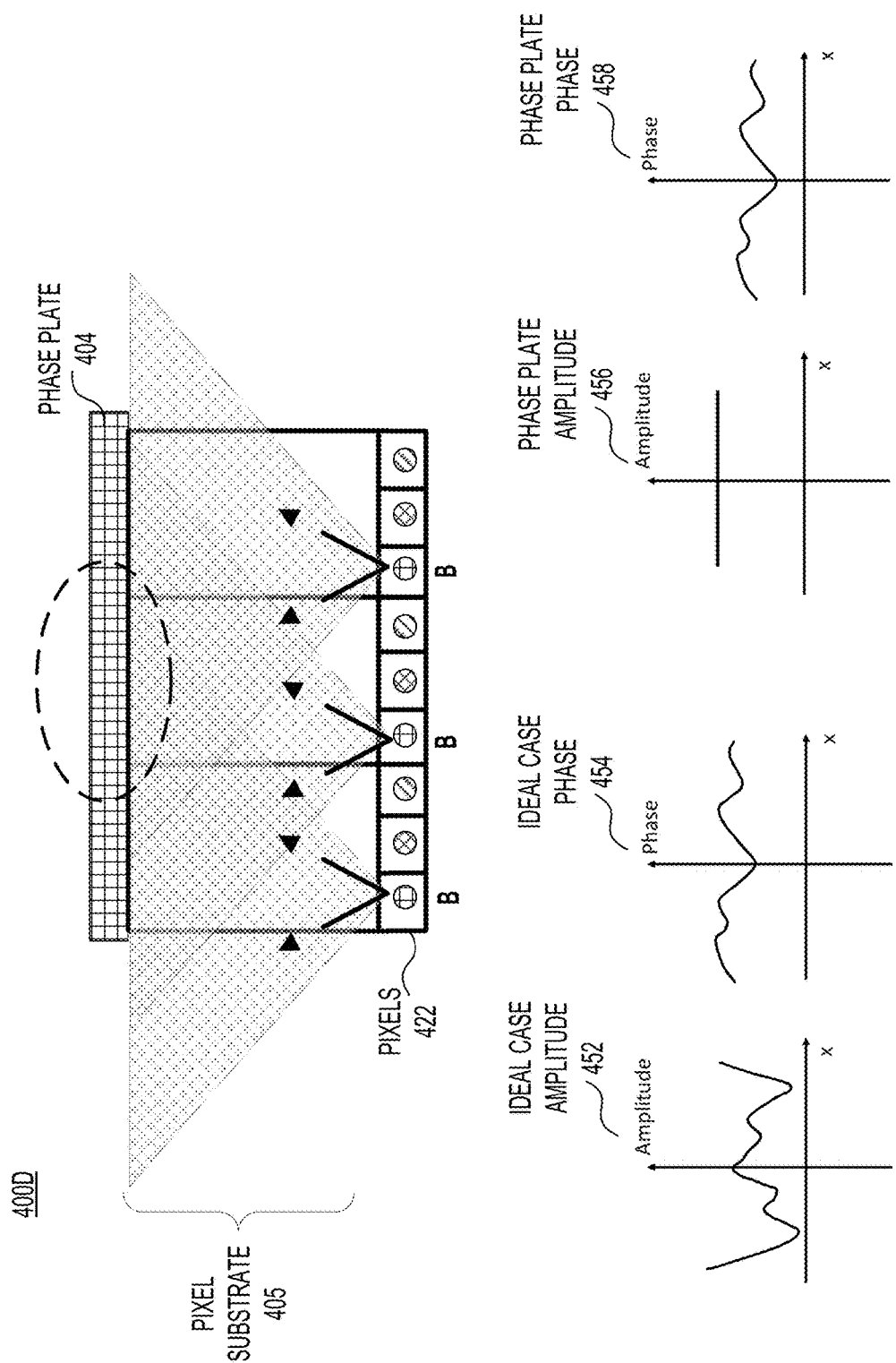

Diagram 400C in FIG. 4C shows an ideal case for the amplitude 442 and for the phase 444 for the green subpixel in comparison with a relatively constant amplitude 446 provided by the phase plate 404 and a phase 448 curve that substantially matches the ideal case. Diagram 400D in FIG. 4D shows an ideal case for the amplitude 452 and for the phase 454 for the green subpixel in comparison with a relatively constant amplitude 456 provided by the phase plate 404 and a phase 458 curve that substantially matches the ideal case.

In some examples, systems and methods for fabrication of a color-separated liquid crystal display (LCD) with laser backlight and a phase plate may also be described. Such display system, as described herein, may be implemented in virtual reality (VR), augmented reality (AR), mixed reality (MR) head-mounted display (HMD) devices. Specifically, the phase plate fabrication method described herein may use an interferometer system to make a hologram of pinholes. The phase plate fabrication method described herein may also repeat the process any number of times with shifted pinholes for other wavelengths. The phase plate fabrication method described herein may also play the hologram with conjugate beam to generate desired illumination pattern(s). Other various examples may also be considered or provided.

Figure 5:
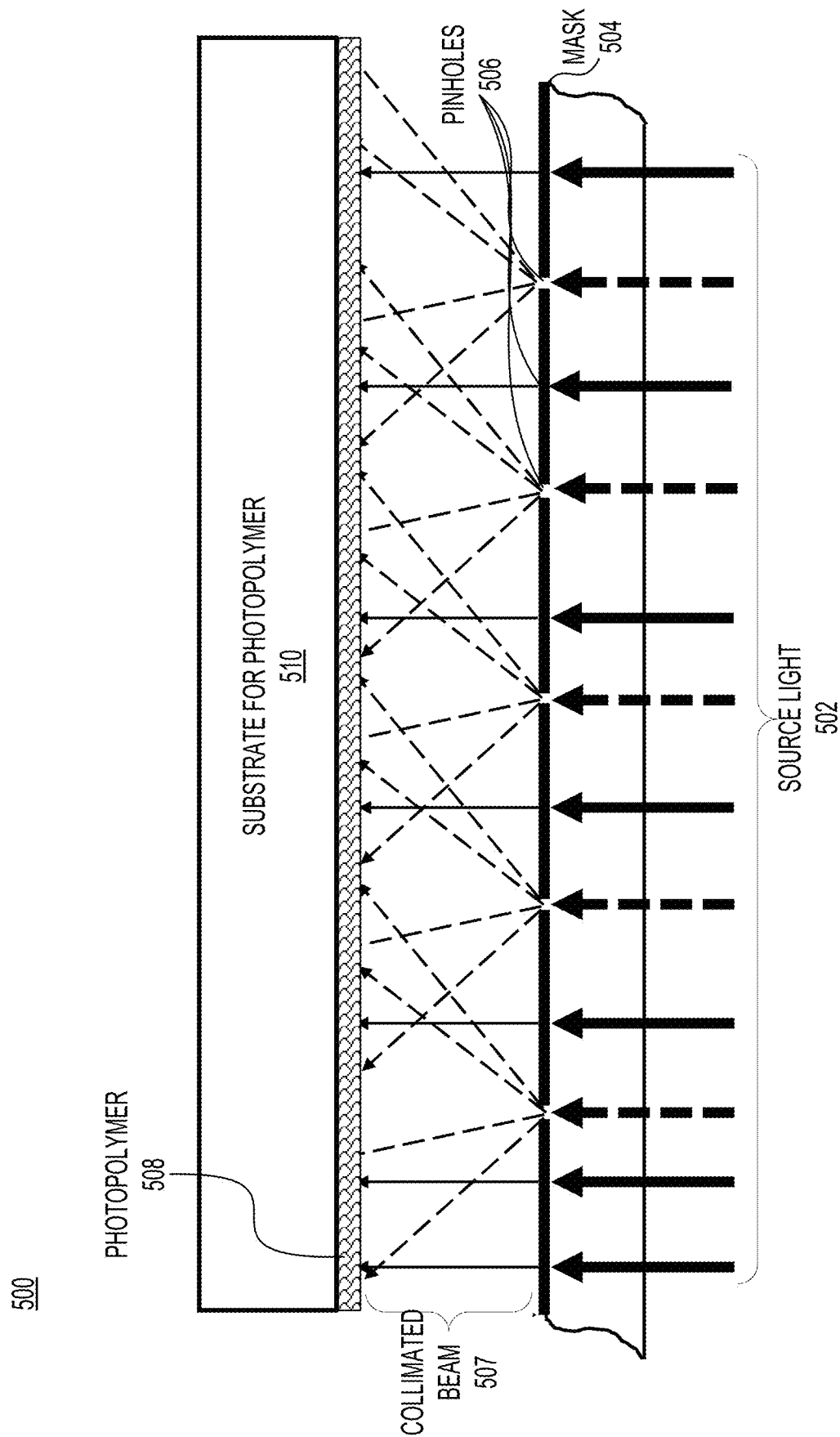
FIG. 5 illustrates an interferometer system for creating hologram of pinholes for phase plate fabrication, according to an example.

FIG. 5 illustrates an interferometer system 500 for creating hologram of pinholes for phase plate fabrication, according to an example. As shown, the interferometer system 500 may include a substrate 510 to which a photopolymer 508 may be attached. In some examples, the photopolymer 508 may have a thickness of about 3 μm or greater (generally <50 μm). A mask 504 with pinholes 506 may also be provided at a distance of approximately 200-500 μm from the photopolymer 508. The mask 504 may be a 1% chrome mask in some examples.

In some examples, the phase plate fabrication method may include a collimated laser light being provided from the bottom of the interferometer system 500 and pass through the 1% chrome mask 504 as a collimated beam 507. In addition to chrome, aluminum, gold, copper, silver, or similar materials may also be used for the mask. It should be appreciated that the laser light may pass through the 1 μm pinholes 506 to create a spherical wavefront. In some examples, the collimated beam 507 may interfere with the spherical wavefront at the photopolymer layer. This interference may help form a desired hologram pattern on the photopolymer 508 for use as a phase plate in a display as described herein. It should be appreciated that a 1 μm pinhole may produce a full width at half maximum (FWHM) cone angle of 40 degrees, which may be expressed as follows:

$$\text{Sin (FFOV/2)} = \text{wavelength/pinhole diameter,} \quad (1)$$

where FFOV represents the full field of view (FOV). In addition, during this step, exposure time may vary between 0.5-6 seconds, depending on laser power and polymer characteristics. In practical implementations, a 10 mW/cm$^2$ laser may be used for approximately 1 second.

In some examples, the above-described process may be repeated with shifted pinholes for other wavelengths. For example, depending on the thickness (e.g., 3-50 μm) and photopolymer characteristics (e.g., index dynamic), the interferometer system 500 may be used to expose different wavelength responses to a different photopolymer. In other words, a red laser may be used to expose, then the pinholes may be shifted, and a green laser used, and then the pinholes may be shifted again for a blue laser, etc. Depending on how many exposures are to be performed, the thickness of the photopolymer 508 may vary. For example, the more exposures to be performed, the thicker the photopolymer may be selected. This is generally because the index dynamic of the photopolymer material may usually be higher for thicker material. Another reason for additional exposure may be to capture more than one wavelength, as discussed herein. In an RGB example, the fabrication process may involve multiplexing the response of the three wavelengths (red, blue, green). In some examples, off axis exposure or other variations may also be used. In these scenarios, the fabrication process may involve additional beam steering, e.g., to expose at any number of different angles as well.

In some examples, more than one photopolymer layer may also be provided. For example, three films may be used. Following exposure for each of these films (red, green, and blue), each of the films may be laminated on top of each other using any number of lamination processing techniques to form a singular component.

FIG. 6 illustrates a configuration 600 using a phase plate with conjugate beam to generate illumination patterns at a liquid crystal display (LCD), according to an example. As shown, the configuration 600 may include photopolymer 604, which may receive RGB light 602 (through a substrate for the photopolymer 604) and provide adjusted light 606 with a particular illumination pattern to the liquid crystal display (LCD) panel 608.

In some examples, the phase plate, formed using the fabrication process discussed in FIG. 5, may be used in the configuration 600. Specifically, the configuration 600 may position the phase plate (photopolymer 604) and hologram with conjugate beam to generate the particular illumination pattern for the liquid crystal display (LCD) panel 608. It should be appreciated that in some examples, the position between the phase plate (photopolymer 604) and the thin film transistor (TFT) layer (e.g., first surface of the liquid crystal display (LCD) panel 608) may be relatively the same distance as the exposure distance (200-500 µm), as shown in FIG. 5. Other various examples, however, may also be considered or provided.

Figure 7A:
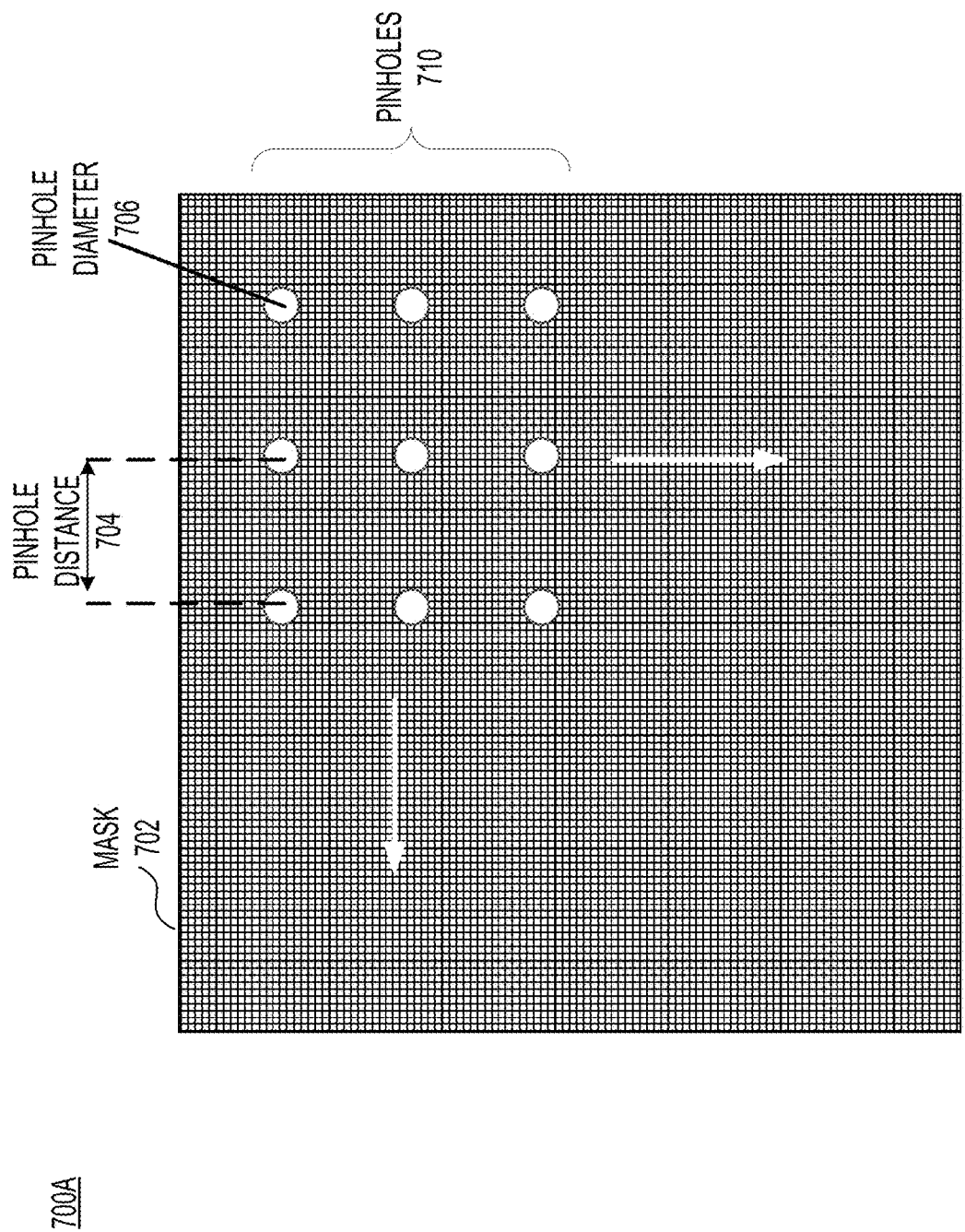
FIGS. 7A-7B illustrates views of an exposure mask for phase plate fabrication, according to an example.
Figure 7B:
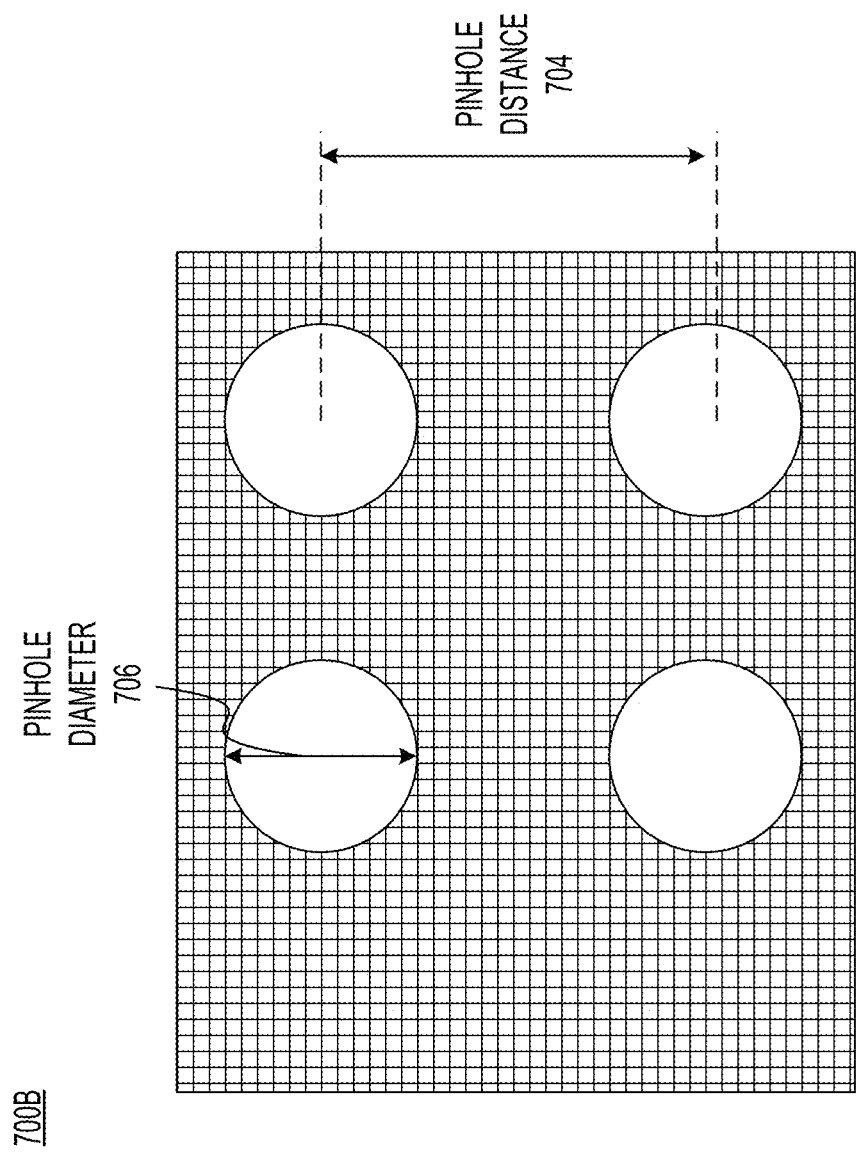

FIGS. 7A-7B illustrate views 700A-700B of an exposure mask for phase plate fabrication, according to an example. In view 700A, a number of pinholes 710 with their respective diameters 706 and distances 704 between two pinholes are shown on a chrome mask 702. In view 700B, a close-up illustration of four pinholes with their respective diameters 706 and pinhole distance 704 is shown.

As described herein, the exposure mask (chrome mask 702) may include a plurality of pinholes 710 (shown in FIG. 7A). In some examples, each of the pinholes may have a diameter 706 of approximately 1 µm. The pinholes 710 may also be patterned across the entirety of the mask, and in some examples, the pinholes 710 may be spaced (pinhole distance 704) at about 18 µm apart. Pinhole diameter d may be determined by a desired display emission cone angle. The pinhole diameter, for example, may be represented by the following expression/equation:

$$d=\lambda*\sin(\theta), \quad (2)$$

where $\lambda$ is the average wavelength, $\theta$ is the emission cone angle full width half maximum (FWHM).

In some examples, the mask 702 may also be coated, for example, with chrome. The size of the mask 702 may range from about 5×5 cm to about 8×8 cm, or any other pertinent size or dimension (see below for calculation). It should also be appreciated that an actual shape of the pinholes 710 need not be entirely circular. Slightly elliptically or similarly shaped pinholes may also be provided. It should be appreciated that the pinhole may be configured with 100% light transmission while the chrome (other portions) of the mask 702 may be configured with 0.4% or less light transmission. Still, the pinhole transmission may be lower than 100% in practical operation and therefore the mask transmission may be scaled accordingly.

A potential calculation for exposure mask dimensions is illustrated in view 700B of FIG. 7B, according to an example. As shown, for a mask having a pinhole with radius r (half of diameter 706) and distance 704 between pinholes p=18 µm, the following expression may be used:

$$T = \frac{\pi r^2}{p^2} = 0.4\% \quad (3)$$

where T may be the relative transmission for the mask region (black) relative to the pinholes (white). For the illumination angle, following expression may be used:

$$\text{Arcsin } (\lambda/2r)=\text{angle}, \quad (4)$$

which may provide 20 degrees for 2r=1.3 µm and $\lambda$ (wavelength)=450 nm. These calculations may be used to maximize the fringe contrast for interference exposure, having about the same light/area between the collimated and spherical wavefront.

It should be appreciated that a configuration as described herein may experience what may be referred to as a "Talbot image plane". In some examples, when collimated light passes through a periodic pinhole structure, a phenomenon known as "Talbot self-imaging plane" may occur at several distances away from the pinhole mask. In other words, when a plane wave is incident upon a periodic diffraction grating, the image of the grating may be repeated at regular distances away from the grating plane. In such a scenario, the regular distance may be referred to as a Talbot length, and the repeated images may be referred to as "self-images" or "Talbot images."

In order to avoid reference beam interference with the Talbot plane (replication of pinhole), the systems and methods described herein may provide at least one of the following solutions. (1) The interference plane may be shifted about 100-200 µm away from Talbot plane (e.g., Talbot plane at 500 µm, then photopolymer may be placed at 600-700 µm); (2) a random phase may be added to the pinhole to break the periodic phase; (3) the 1 µm pinhole location may be randomized by a one or two µm offset to avoid periodic pattern; and/or (4) two or more sets of masks may be used, where each mask increases the period and thereby changes the Talbot distance.

In addition to the methods, processes, and/or techniques described above, there may be any number of ways to create the phase masks for the phase plate solution for improved light transmissions in a display system. These may include photolithography (binary or grayscale), nanoimprint, meta- or nanostructure (e.g., nanopillars), or other similar methods, processes, and/or techniques. Depending on cost, speed, and ease of use, these and/or other methods, processes, and/or techniques may be incorporated into the systems and methods described herein.

According to some examples, a phase plate may include a transparent substrate and a photopolymer layer attached to the transparent substrate. The photopolymer layer may adjust a backlight via a phase adjustment and focusing. The phase plate may focus a plurality of red, green, and blue components of the backlight onto respective red, green, and blue subpixels of a thin-film-transistor (TFT) layer deposited thereon. A distance between the photopolymer layer of the phase plate and the plurality of red, green, and blue subpixels of the thin-film-transistor (TFT) layer may be in a range from about 200 µm to about 500 µm.

According to some examples, the phase plate may focus the plurality of red, green, and blue components of the backlight onto the respective red, green, and blue subpixels of the thin-film-transistor (TFT) layer to cause each of the plurality of red, green, and blue subpixels transmit light at a full width at half maximum (FWHM) cone angle of about 40 degrees. The photopolymer layer of the phase plate may have a thickness that is in a range from about 3 µm to about 50 µm. The photopolymer layer of the phase plate may be fabricated via an exposure technique that exposes the photopolymer layer to a collimated laser light and a thickness of the photopolymer layer may be selected, at least in part, based on the exposure technique.

According to some examples, a liquid crystal display (LCD) apparatus may include a red, green, blue (RGB) laser to provide backlight; a grating light guide to transmit the backlight; a phase plate including a transparent substrate and a photopolymer layer to adjust the backlight via a phase adjustment and focusing; a thin-film-transistor (TFT) layer on the phase plate, where the phase plate may focus a plurality of red, green, and blue components of the backlight onto respective red, green, and blue subpixels of the thin-film-transistor (TFT) layer; and a liquid crystal display (LCD) layer on the thin-film-transistor (TFT) layer.

According to some examples, the liquid crystal display (LCD) apparatus may further include at least one or more of a first polarizer layer between the phase plate and the thin-film-transistor (TFT) layer; a color filter on the liquid crystal display (LCD) layer; or a second polarizer layer on the color filter. The phase plate may focus the plurality of red, green, and blue components of the backlight onto the respective red, green, and blue subpixels of the thin-film-transistor (TFT) layer to cause each of the plurality of red, green, and blue subpixels transmit light at a full width at half maximum (FWHM) cone angle of about 40 degrees.

According to some examples, each of the plurality of red, green, and blue subpixels may have a width in a range from about 2 μm to about 5 μm, and each pixel has a width in a range from about 10 μm to about 25 μm. The photopolymer layer of the phase plate may have a thickness that is in a range from about 3 μm to about 50 μm. The photopolymer layer of the phase plate may be fabricated via an exposure technique that exposes the photopolymer layer to a collimated laser light. A thickness of the photopolymer layer may be selected, at least in part, based on the exposure technique.

According to some examples, a method for providing a phase plate for a display device may include providing an interferometer system to generate a hologram of a plurality of pinholes. The interferometer system may include a transparent substrate for photopolymer layer attachment; a photopolymer layer having a predetermined thickness; and an exposure mask having the plurality of pinholes. The method may also include exposing the photopolymer layer to a collimated light, via a laser source, through the exposure mask. The collimated light may pass through at least one of the exposure mask itself to create a collimated beam or the plurality of pinholes to create a spherical wavefront, and the collimated beam and the spherical wavefront, at least in part, may generate the hologram.

According to some examples, the method may further include iteratively shifting pinhole placement for repeated exposure of the photopolymer layer with the collimated light for additional wavelengths. Iteratively shifting the pinhole placement for repeated exposure of the photopolymer layer with the collimated light for additional wavelengths may include shifting the pinhole placement and exposing the photopolymer layer to red, blue, and green collimated laser lights; or multiplexing responses of red, blue, and green collimated laser lights. The method may further include employing one or more of off axis exposure or beam steering to expose the photopolymer layer at one or more different angles.

According to some examples, the method may further include selecting a distance between the photopolymer layer and the exposure mask, at least in part, based on a distance between the phase plate and a thin-film-transistor (TFT) layer of a liquid crystal display (LCD) stack that includes the phase plate. Each pinhole may have a diameter of about 1 μm and a distance between two pinholes is about 18 μm, and/or the pinholes may have a circular of elliptical shape. A surface of the exposure mask may be covered with 1% chrome, and/or a size of the exposure mask may be in a range from about 5 cm×5 cm to about 8 cm×8 cm. The photopolymer layer may include a plurality of films and the method may further include exposing each film to the collimated light through the exposure mask; and laminating each film on another exposed film. In some examples, A non-transitory computer-readable storage medium may have an executable stored thereon, which when executed instructs a processor to perform the method described herein.

In the foregoing description, various inventive examples are described, including devices, systems, methods, and the like. For the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example' is not necessarily to be construed as preferred or advantageous over other embodiments or designs.

Although the methods and systems as described herein may be directed mainly to digital content, such as videos or interactive media, it should be appreciated that the methods and systems as described herein may be used for other types of content or scenarios as well. Other applications or uses of the methods and systems as described herein may also include social networking, marketing, content-based recommendation engines, and/or other types of knowledge or data-driven systems.

The invention claimed is:
1. A phase plate comprising:
a transparent substrate; and
a photopolymer layer attached to the transparent substrate, the photopolymer layer to adjust a backlight via a phase adjustment and focusing, wherein:
the phase plate is to focus a plurality of red, green, and blue components of the backlight onto respective red, green, and blue subpixels of a thin-film-transistor (TFT) layer deposited thereon, and
a distance between the photopolymer layer of the phase plate and the plurality of red, green, and blue subpixels of the thin-film-transistor (TFT) layer is in a range from about 200 μm to about 500 μm.

2. The phase plate of claim 1, wherein the phase plate is to focus the plurality of red, green, and blue components of the backlight onto the respective red, green, and blue subpixels of the thin-film-transistor (TFT) layer to cause each of the plurality of red, green, and blue subpixels transmit light at a full width at half maximum (FWHM) cone angle of about 40 degrees.

3. The phase plate of claim 1, wherein the photopolymer layer of the phase plate has a thickness that is in a range from about 3 μm to about 50 μm.

4. The phase plate of claim 3, wherein the photopolymer layer of the phase plate is fabricated via an exposure technique that exposes the photopolymer layer to a collimated laser light and a thickness of the photopolymer layer is selected, at least in part, based on the exposure technique.

* * * * *